United States Patent
Choy

(10) Patent No.: US 6,176,737 B1
(45) Date of Patent: Jan. 23, 2001

(54) DUPLEX CONNECTOR ASSEMBLY FOR USE WITH PLURAL CARDS

(75) Inventor: Edmond Choy, Union City, CA (US)

(73) Assignee: Hon Hai Precision Ind. Co., Ltd., Taipei Hsein (TW)

(*) Notice: Under 35 U.S.C. 154(b), the term of this patent shall be extended for 0 days.

(21) Appl. No.: 09/500,752

(22) Filed: Feb. 8, 2000

Related U.S. Application Data

(63) Continuation-in-part of application No. 09/270,380, filed on Mar. 16, 1999, now Pat. No. 6,113,398, which is a continuation-in-part of application No. 08/858,218, filed on May 10, 1997, now Pat. No. 5,882,211, and a continuation-in-part of application No. 09/084,809, filed on May 26, 1998, now Pat. No. 6,126,472, and a continuation-in-part of application No. 08/692,823, filed on Jul. 29, 1996, now Pat. No. 5,755,585, which is a continuation-in-part of application No. 08/393,704, filed on Feb. 24, 1995, now Pat. No. 5,833,478.

(51) Int. Cl.$^7$ ............................. H01R 13/60; H01R 13/66

(52) U.S. Cl. ........................................................... 439/541.5

(58) Field of Search ................................ 439/64, 74, 326, 439/541.5

(56) References Cited

U.S. PATENT DOCUMENTS 5,514,002 * 5/1996 Cheng et al. ........................ 439/326

* cited by examiner

Primary Examiner—Neil Abrams
Assistant Examiner—Javaid Nasri
(74) Attorney, Agent, or Firm—Wei Te Chung

(57) ABSTRACT

A connector assembly includes a first connector and a second connector are head to head positioned on the mother board. The first connector includes an unitary housing defining an upper and a lower central slot for receiving respectively two memory modules. A row of first passageways and another row of second passageways respectively formed in the front half portion and the rear half portion of the housing of the first connector. The first passageways and the second passageways are alternately arranged in a staggered manner along the lengthwise direction of the housing of the first connector. A first contact is received within the corresponding first passageway and a second contact is received within the corresponding second passageway, wherein each of the first contact and the second contact includes spring arms respectively extending into both the upper and the lower central slots, while the first contact includes the solder tail extending forwardly beyond the front face of the housing and the second contact includes the solder tail extending rearwardly beyond the rear face of the housing. Similarly, the second connector includes the similar structures to the first connector while being arranged in reverse manner with regard to the first connector.

9 Claims, 8 Drawing Sheets

DUPLEX CONNECTOR ASSEMBLY FOR USE WITH PLURAL CARDS (This is a continuation-in-part of the application Ser. No. 09/270,380 filed Mar. 16, 1999, now U.S. Pat. No. 6,113,398 which is a continuation-in-part of the application Ser. No. 08/858,218 filed May 10, 1997, now U.S. Pat. No. 5,882,211, and a continuation-in-part of the application Ser. No. 09/084,809 filed May 26, 1998, now U.S. Pat. No. 6,126,472, which is a continuation of the application Ser. No. 08/692,823 filed Jul. 29, 1996, now U.S. Pat. No. 5,755,585 which is a continuation-in-part of the application Ser. No. 08/393,704 filed Feb. 24, 1995, now U.S. Pat. No. 5,833,478.)

BACKGROUND OF THE INVENTION

1. Field of the Invention

The invention relates to card edge connector assembly, and particularly to the connectors arrangement in both vertical and horizontal directions simultaneously for being adapted to receive four cards within a dense space.

2. The Related Art

U.S. Pat. No. 5,514,002 discloses a so-called Mini SIMM connector, of which a variation is a so-called SO DIMM connector, both of which are receiving memory modules therein. It can be appreciated that it is desired to have plural memory modules in the computer, so it is required to use the limited space in the computer while providing as many connectors as possible to receive such plurality of modules.

U.S. Pat. Nos. 5,697,802, 5,755,585 and 5,833,478 disclose the so-called stacked type connector assembly regardless of whether the connector housings thereof are of the integral type or the separate type, whereby only the minimum region is required on the mother board on which the connector assembly is seated. Differently, U.S. Pat. No. 5,882,211 discloses one regular type simplex connector and one reverse type simplex connector face to face mounted on the mother board with a plurality of parallel circuit traces each connected between one contact of the regular type connector and another contact of the reverse type connector. It can be understood that the former sacrifices the height of the computer to achieve the smaller horizontal dimension of the computer, while the latter sacrifices the horizontal area to achieve the thinner size of the computer. Understandably, regardless of whether either the former or the latter has its own advantages and disadvantages, both these two kinds of arrangement are essentially of one dimensional extension for expansion, i.e., either the vertical way or the horizontal way.

It is also noted that in U.S. Pat. No. 5,882,211, the two horizontally lying opposite connectors are sharing the same circuit traces on the mother board, and in U.S. Pat. No. 5,697,802, the two vertically stacked connector units are sharing the same unitarily formed contacts and the corresponding circuit traces on the mother board, so that the manufacturing may become easy.

Based on increasing of the functions and speed requirements of the computer, there is a desired to have more than two memory modules installed in the computer, for example, four memory modules being required thereof, so it is critical for the computer designer to efficiently arrange the multiple connectors/modules in such a limited space in the computer.

Therefore, an object of the invention is to provide the connector assembly which is adapted to receive more than two memory modules in a dense space in the computer case wherein the connector assembly is arranged to extend in both the vertical and horizontal directions wherein the arrangement along the vertical direction is of a stacked type which is generally disclosed in the copending application having the title "DUPLEX PROFILE CONNECTOR ASSEMBLY" filed Feb. 4, 2000 with a Ser. No. 09/498,828, and having the same assignee with the invention.

SUMMARY OF THE INVENTION

According to an aspect of the invention, a connector assembly includes a first connector and a second connector generally reverse to the first connector. The first connector includes an unitary housing defining an upper and a lower central slot for receiving respectively two memory modules. A row of first passageways and another row of second passageways respectively formed in the front half portion and the rear half portion of the housing of the first connector. The first passageways and the second passageways are alternately arranged in a staggered manner along the lengthwise direction of the housing of the first connector. A first contact is received within the corresponding first passageway and a second contact is received within the corresponding second passageway, wherein each of the first contact and the second contact includes spring arms respectively extending into both the upper and the lower central slots, while the first contact includes the solder tail extending forwardly beyond the front face of the housing and the second contact includes the solder tail extending rearwardly beyond the rear face of the housing.

Similarly, the second connector includes another unitary housing defining upper and lower central slots therein. A row of third passageways and another row of fourth passageways are respectively formed in the front half portion and the rear half portion of the housing of the second connector. The third passageways and the fourth passageways are alternately arranged in a stagger manner along the lengthwise direction of the housing of the second connector. A third contact is received within the corresponding third passageway and a fourth contact is received within the corresponding fourth passageway, wherein each of the third contact and the fourth contact includes springs arms respectively extending into both the upper and the lower central slots, while the third contact includes the solder tail extending forwardly beyond the front face of the housing of the second connector, and the fourth contact includes the solder tail extending rearwardly beyond the rear face of the housing of the second connector.

A plurality of parallel circuit traces are provided on the mother board on which the connector assembly is seated, each of the circuit traces is connected between either the two solder tails of the two aligned first contact and fourth contact, or the two solder tails of the two aligned second contact and third contact.

Each of some of the aligned first contacts and fourth contacts, and the aligned second contacts and third contacts, is replaced by two contact members instead of the integral type contact thereof. The two contact members include an outer contact member and an inner contact member wherein the outer contact member includes an SMT (Surface Mount Technology) type solder tail and the inner contact member includes a through hole type solder tail. Under this situation, a circuit trace is connected between the SMT type solder tails of the two outer contact members, and another circuit trace is connected between the through hole type solder tails of the two inner contact members, even though all the two outer contact members and two inner contact members are aligned together.

DETAILED DESCRIPTION OF THE PREFERRED EMBODIMENTS

Figure 1:
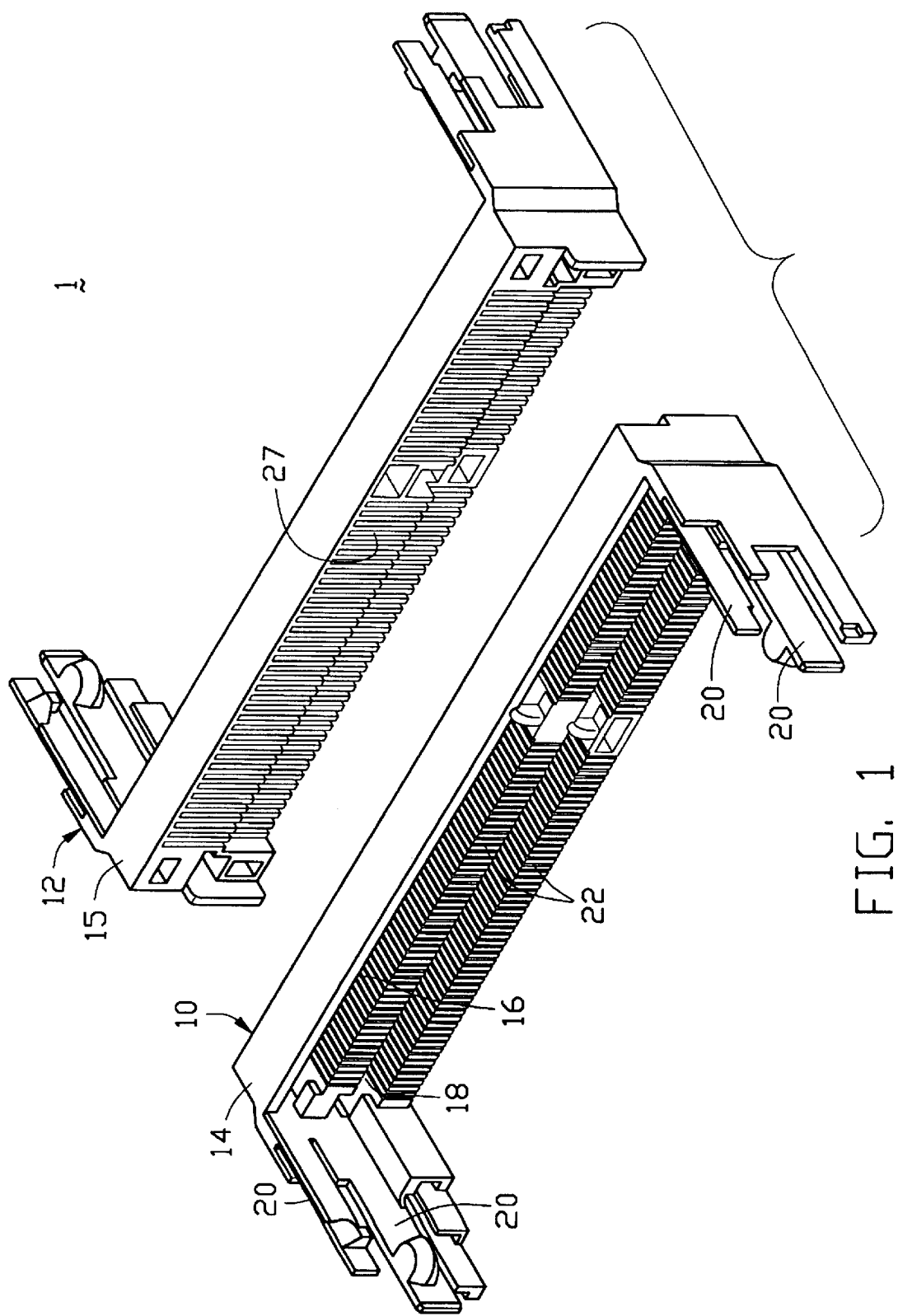
FIG. 1 is a perspective view of a presently preferred embodiment of a connector assembly according to the invention without showing contacts therein.
Figure 2:
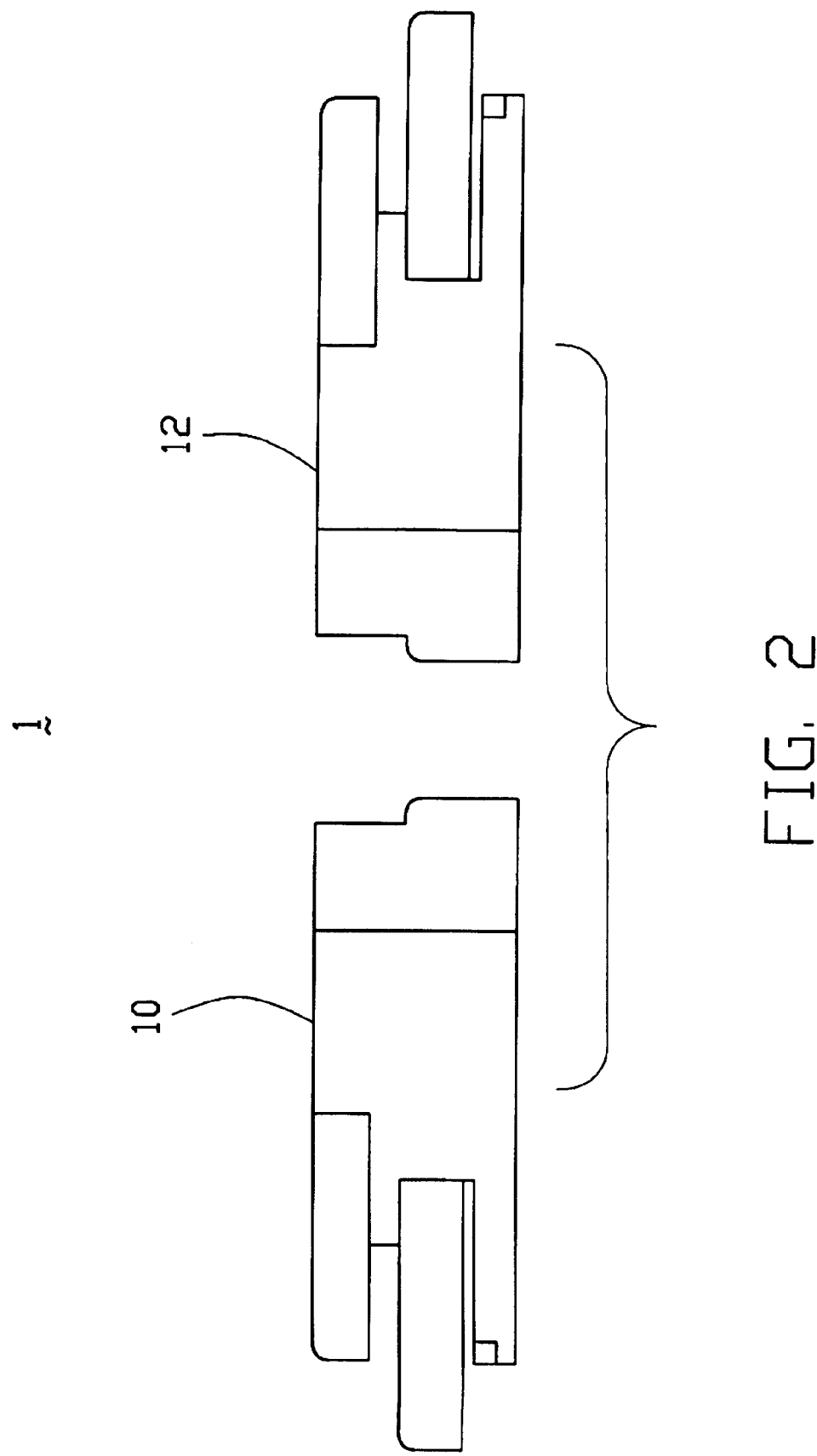
FIG. 2 is a side view of the connector assembly of FIG. 1.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–6 wherein the connector assembly 1 includes a regular type first connector 10 and a reverse type second connector 12. The first connector 10 includes a unitary first housing 14 with upper and lower central slots 16, 18 extending therein along a lengthwise direction of the housing 14. A pair of latching arms 20 extending forwardly from two opposite ends of the housing 14. A row of first passageways 22 are formed in a front half portion 24 of the housing 14, while another row of second passageways 26 are formed in a rear half portion 28 of the housing 14, wherein the first passageways 22 and the second passageways 26 are alternately arranged in a staggered manner along the lengthwise direction of the housing 14 (FIG. 4). Similarly, the second connector 12 includes a unitary second housing 15 with upper and lower central slots 17, 19, and a row of third passageways 23 and another row of fourth passageways 27 being alternately staggered one another lengthwisely in the front half portion 25 and the rear half portion 29 of the second housing 15.

Figure 5:
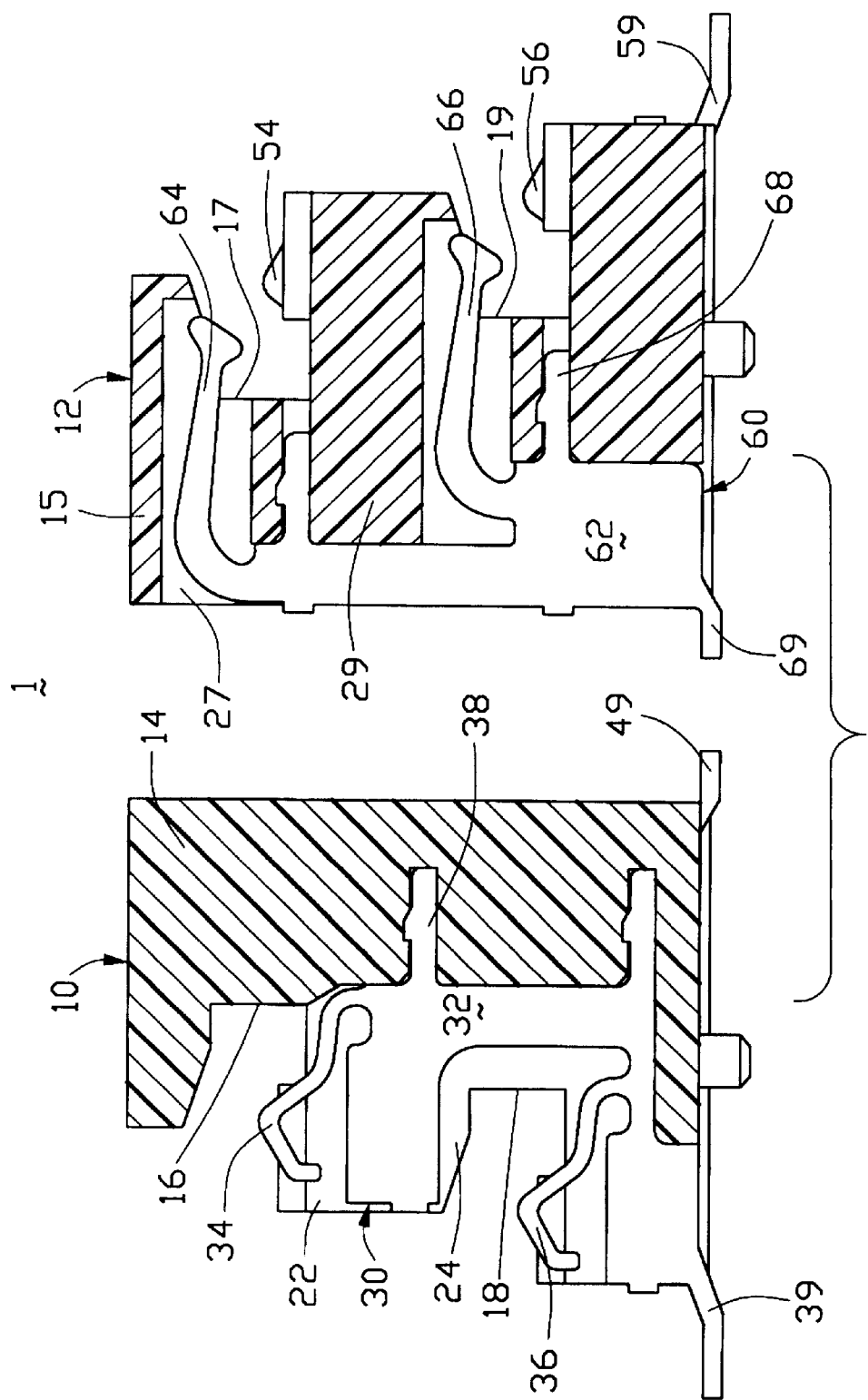
FIG. 5 is a cross-sectional view of the assembly showing the aligned first contact in the first passageway of the first connector and fourth contact in the fourth passageway of the second connector.
Figure 6:
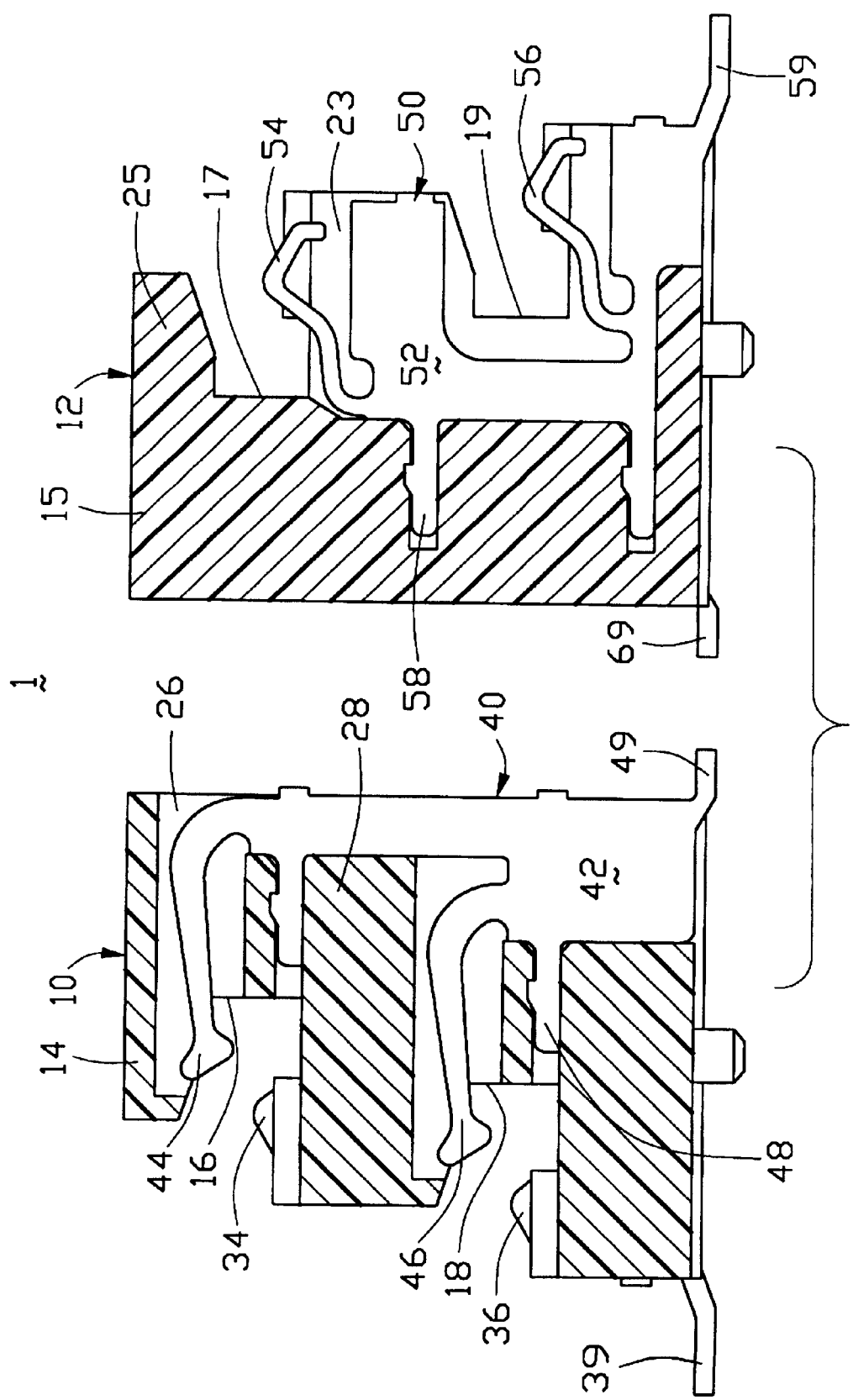
FIG. 6 is a cross-sectional view of the assembly showing the aligned second contact in the second passageway of the first connector and third contact in the third passageway of the second connector.

Referring to FIGS. 5 and 6, a first contact 30 is received within a corresponding first passageway 22 wherein the first contact 30 includes a main body 32, upper and lower spring arms 34, 36 respectively extending into the corresponding upper and lower central slots 16, 18, retention sections 38 engaged with the housing 14, and an SMT type solder tail 39 extending therefrom forwardly with regard to the housing 14. Similarly, a second contact 40 is received within a corresponding second passageway 26 wherein the second contact 40 includes a main body 42, upper and lower spring arms 44, 46 extending into the corresponding central slots 16, 18, retention sections 49 engaged with the housing 14, and an SMT type solder tail 49 extending therefrom rearwardly with regard to the housing 14.

Similarly and generally symmetrical to the first connector, in the second connector 12, each third passageway 23 receives a third contact 50 therein wherein the third contact 50 includes a main body 52, upper and lower spring arms 54, 56 extending into the corresponding upper and lower central slot 17, 19, retention sections 58 engaged with the housing 15, and an SMT type solder tail 59 extending therefrom forwardly with regard to the housing 15; similarly, a fourth contact 60 is received within a corresponding fourth passageway 27 wherein the fourth contact 60 includes a main body 62, upper and lower spring arms 64, 66 extending into the corresponding central slot 17, 19, retention sections 68 engaged with the housing 15, and an SMT type solder tail 69 extending rearwardly therefrom with regard to the housing 15.

It can be seen that the first contact 30 is similar to the third contact 50, and the second contact 40 is similar to the fourth contact 60, and all of them are planewise. It results in more economic in manufacturing.

Figure 3:
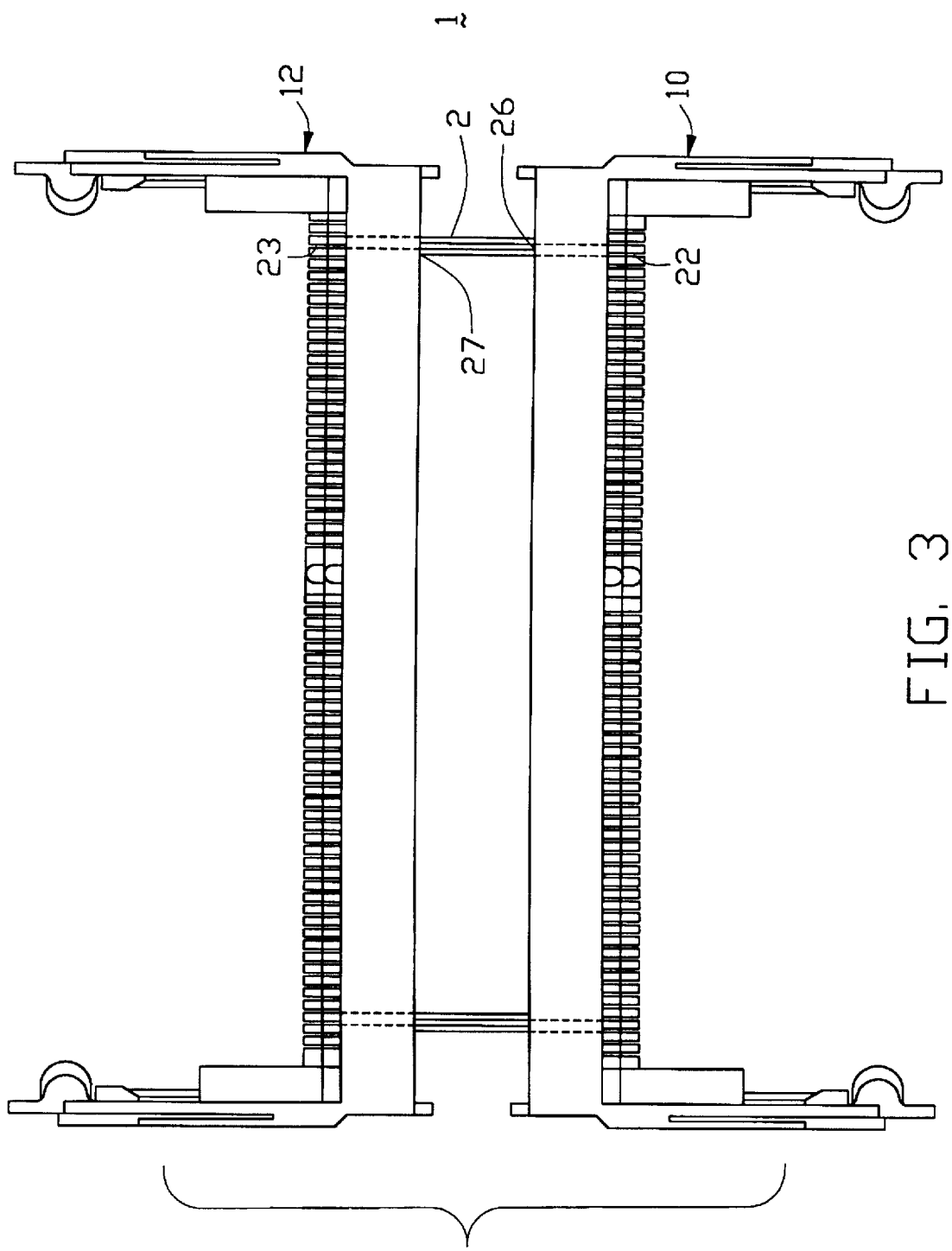
FIG. 3 is a top view of the connector assembly of FIG. 1 showing the parallel circuit traces printed on the mother board in alignment with the corresponding first/fourth passageways or the corresponding second/third passageways for respectively connecting the two aligned corresponding contacts of two respective connectors in the corresponding passageways.
Figure 4:
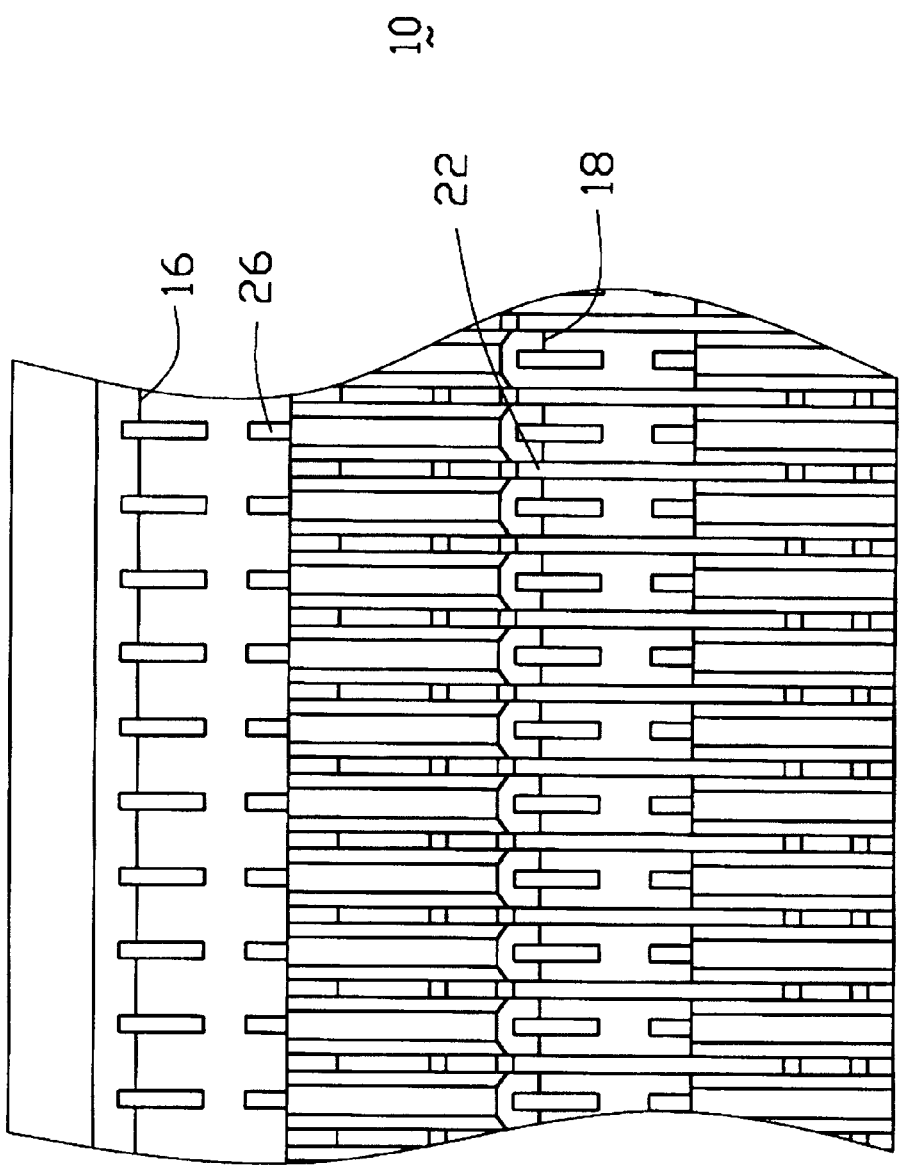
FIG. 4 is a partial front view of the first connector showing the first passageways and the second passageways are offset from each other in a staggered manner along the lengthwise direction of the housing.

Referring to FIGS. 3, 5 and 6, wherein only the first passageways 22 and the third passageways 23 are shown in the respective connectors 10, 12 with the second passageways 26 and the fourth passageways 27 hidden under the housing 14, 15, because the connector 10 is of regular type and the connector 12 is of the reverse type, the first passageways 22 are aligned with the corresponding fourth passageways 27, respectively, and the second passageways are aligned with the corresponding third passageways 23, respectively. Under this situation, each of the parallel circuit traces 2 is connected between either the aligned solder tail 39 of the first contact 30 and solder tail 69 of the fourth contact 60, or the aligned solder tail 49 of the second contact 40 and solder tail 59 of the third contact 59. It is noted that because the contacts are inserted into the corresponding housing of the connector from two opposite sides thereof, and the solder tails of the contacts extend around two sides of the housing, the circuit traces connecting the solder tails of the contacts of the two connectors, are staggered along the lengthwise direction of the housing on the mother board each with the dimension about the pitch defined between the connectors 10, 12. Under this type design, the region used on the mother board gets smaller, and the assembling gets scientifically easy and systematic.

Therefore, the two modules (not shown), which are respectively inserted into the upper and lower slots 16, 18 in the connector 10, share the same first and second contacts 30, 40 with each other for signal transmission, and furthermore share the circuit traces 2 with the other two modules (not shown), which are respectively inserted into the upper and lower central slots 17, 19 in the connector 12 and share the same third and fourth contacts 50, 60 with each other. Accordingly, the connector assembly 1 can simultaneously use with four modules within a limited space wherein the connector assembly 1 has a dimension generally twice that of the traditional simplex SO DIMM connector in both the vertical and horizontal direction.

Figure 7:
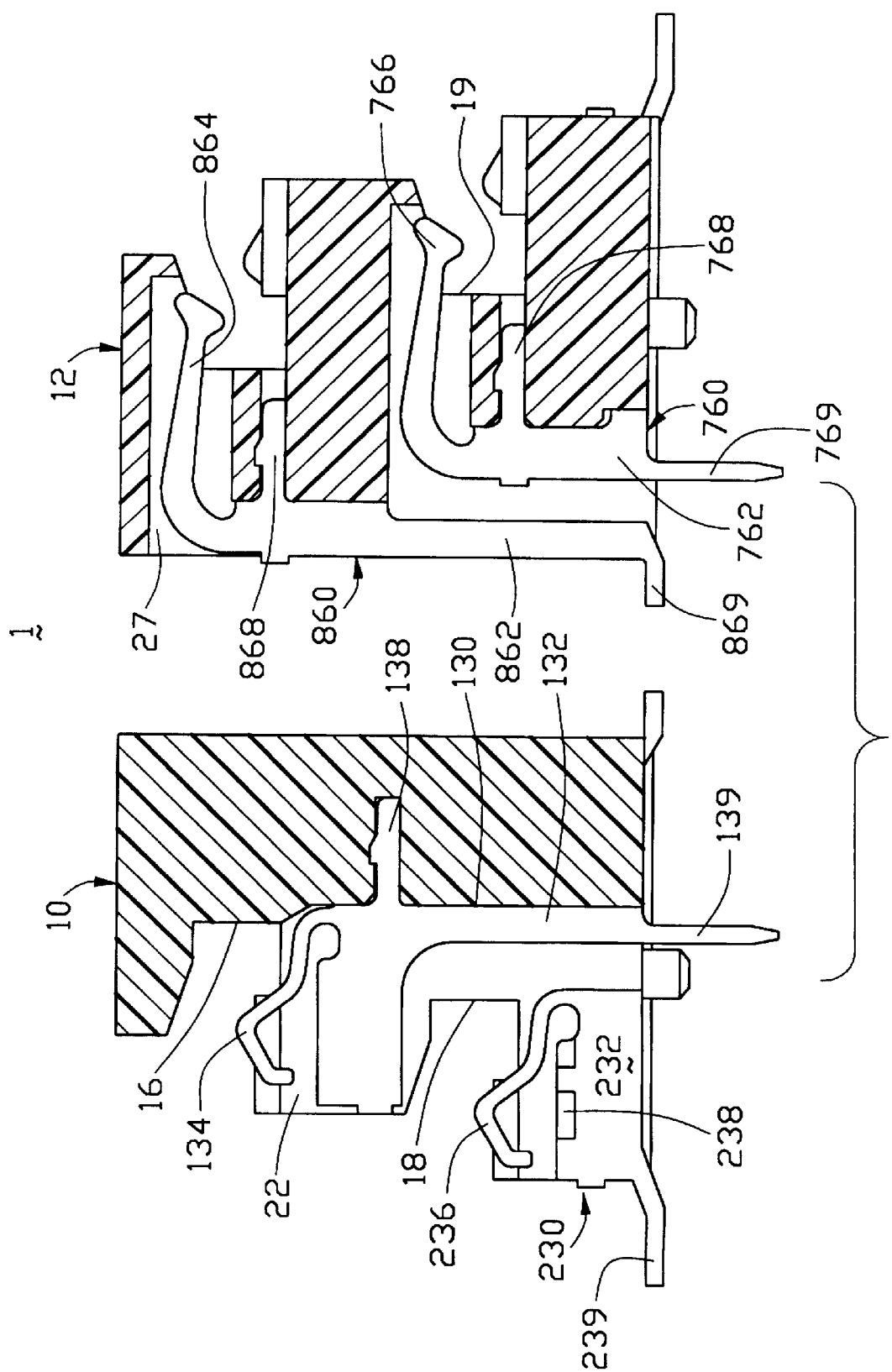
FIG. 7 is a cross-sectional view of the assembly showing the aligned first inner/outer contact member in the first passageway of the first connector and fourth inner/outer contact member in the fourth passageway of the second connector.

Referring to FIG. 7, in some of the first passageways 22 of the first connector 10, the first contact 30 is replaced by a pair of coplanar first inner contact member 130 and first outer contact member 230. The first inner contact member 130 includes a main body 132, a spring arm 134 extending into the upper central slot 16, a retention section 138, and a through hole type solder tail 139 extending downwardly therefrom. Similarly, the first outer contact member 230 includes a main body 232, a spring arm 236 extending into the lower central slot 18, a retention embossment 238, and a SMT type solder tail 239 extending forwardly therefrom.

Correspondingly and similarly, in the corresponding aligned fourth passageway 27 of the second connector 12, the fourth contact 60 is replaced by the coplanar fourth inner contact member 760 and fourth outer member 860. The fourth inner member 760 includes a main body 762, a spring arm 766 extending into the lower central slot 19, a retention section 768, and a through hole type solder tail 769 extending downwardly therefrom. The fourth outer member 860 includes a main body 862, a spring arm 864 extending into the upper central slot 17, a retention section 868, and an SMT type solder tail 869 extending rearwardly therefrom.

Understandably, one circuit trace is connected between the solder tail 239 of the first outer contact member 230 of the first connector 10 and the solder tail 869 of the fourth outer contact member 860 of the second connector 12, while another separate circuit trace is connected between the solder tail 139 of the first inner member 130 and the solder tail 769 of the fourth inner contact member 860.

Figure 8:
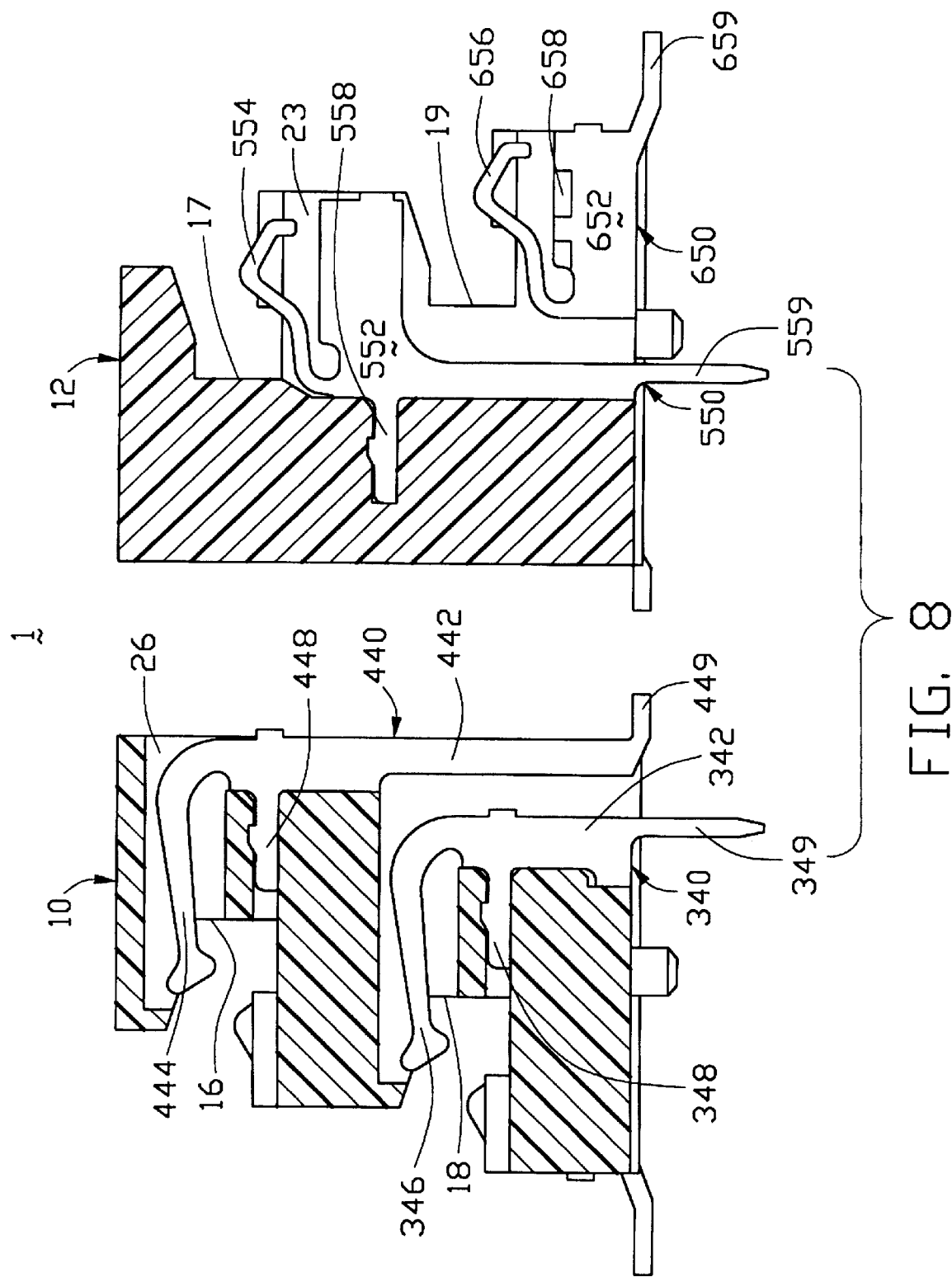
FIG. 8 is a cross-sectional view of the assembly showing the aligned second inner/outer contact member in the second passageway of the first connector and third inner/outer contact member in the third passageway of the second connector.

Similarly, referring to FIG. 8, in some second passageways 26, the second contact 40 is replaced by a pair of coplanar second inner contact member 340 and second outer contact member 440. The second inner contact member 340 includes a main body 342, a spring arm 346 extending into the lower central slot 18, a retention section 348, and a through hole type solder tail 349 extending downwardly therefrom, and the second outer contact member 440 includes a main body 442, a spring arm 444 extending into the upper central slot 16, a retention section 448, and an SMT type solder tail 449 extending rearward therefrom.

Correspondingly and similarly, in some of the third passageways 23 of the second connector 12 in alignment with such a second passageway 26 of the first connector 10, the third contact 50 is replaced by a pair of coplanar third inner contact member 550 and third outer contact member 650. The third inner contact member 550 includes a main body 552, a spring arm 554 extending into the upper central slot 17, a retention section 558, and a through hole type solder tail 559, and the third outer contact member 650 includes a main body 652, a spring arm 656 extending into the lower central slot 19, a retention section 658, and an SMT type solder tail 659 extending forwardly therefrom.

Understandably, a circuit trace is connected between the solder tail 349 of the second inner contact member 340 and the solder tail 559 of the third inner contact member 550, while another parallel circuit trace is connected between the solder tail 449 of the second outer contact member 440 and the older tail 659 of the third outer contact member 650.

The above generally illustrates a presently preferred embodiment of the connector assembly which is characterized to includes a pair of opposite card edge type connectors each further in a stacked form for receiving a plurality of cards (modules) therein. It can be noted that even though this embodiment discloses the connector assembly for use with the SO DIMM connector unit and its corresponding module, it can be appreciated that other type card edge connectors such as the traditional DIMM with ejectors, the PCI card edge connectors, etc., may be applied to this arrangement for expanding the capability of accommodating multiple modules therein.

It is also noted that in some certain situation, the first connector and the second connector may be made with an integral housing as a variation of the invention, wherein each connector may install its own contacts only along one direction instead of the two opposite directions as disclosed in the aforementioned preferred embodiment. Regardless of whether one integral housing or two separate housings for the two connectors are involved in the structure design, the feature of the invention is characterized to include means for receiving not only at least two modules in an opposite horizontal manner, but also at least two modules in a vertical direction in at least one connector. Under this arrangement, more than two modules may be compactly and conveniently used within a limited space in the computer.

It is also noted that even though the embodiment only discloses two slot units are stacked in each housing of the first and second connectors, it can be appreciated that each housing may define more than two central slots in a vertical direction to accommodate more than two memory modules under the similar structure arrangement. Understandably, the corresponding contact should provide more than two spring arms for respective engagement with such modules.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim.

Therefore, person of ordinary skill in this field are to understand that all such equivalent structures are to be included within the scope of the following claims.

I claim:

1. A duplex connector assembly mounted to a mother board, comprising:
    a first connector including a first insulative housing defining at least upper and lower first central slots;
    a row of first passageways formed in a front half portion of the first housing;
    another row of second passageways formed in a rear half portion of the first housing;
    a plurality of first contacts received within the corresponding first passageways, respectively, each of said first contacts including upper and lower first spring arms respectively extending into the corresponding upper and lower first central slots, a first solder tail extending forwardly with regard to the first housing;
    a plurality of second contacts received within the corresponding second passageways, respectively, each of the second contacts including upper and lower second spring arms respectively extending into the corresponding upper and lower first central slots, a second solder tail extending rearwardly with regard to the first housing;

a second connector face to face confronting the first connector, said second connector including a second insulative housing defining at least upper and lower second central slots;
  a row of third passageways formed in a front half portion of the second housing;
  another row of fourth passageways formed in a rear half portion of the second housing;
  a plurality of third contacts received within the corresponding third passageways, respectively, each of said third contacts including upper and lower third spring arms respectively extending into the corresponding upper and lower second central slots, a third solder tail extending forwardly with regard to the second housing;
  a plurality of fourth contacts received within the corresponding fourth passageways, respectively, each of the fourth contacts including upper and lower fourth spring arms respectively extending into the corresponding upper and lower second central slot, a fourth solder tail extending rearwardly with regard to the first housing.

2. The assembly as described in claim 1, wherein the first passageways are aligned with the corresponding fourth passageways, respectively, and the second passageways are aligned with the corresponding third passageways, respectively.

3. The assembly as described in claim 1, wherein a circuit trace is connected between the first solder tail of the first contact in the first connector and the corresponding fourth solder tail of the fourth contact in the second connector, and another circuit trace is connected between the second solder tail of the second contact in the first connector and the corresponding third solder tail of the third contact in the second connector.

4. The assembly as described in claim 1, wherein the first contacts are respectively inserted into the corresponding first passageways in a first direction while the second contacts are respectively inserted into the corresponding second passageways in a second direction opposite to the first direction.

5. The assembly as described in claim 4, wherein the third contacts are respectively inserted into the corresponding third passageways in the second direction, while the fourth contacts are respectively inserted into the corresponding fourth passageways in the first direction.

6. The assembly as described in claim 1, wherein in each of some first passageways, the corresponding first contact is replaced by a pair of separate coplanar first inner contact member and outer contact member, and in each of some fourth passageways which are respectively aligned with said some first passageways, the corresponding fourth contact is replaced by a pair of separate coplanar fourth inner contact member and outer contact member, and a circuit trace is connected between the first inner contact member and the fourth inner contact member, and another circuit trace is connected between the first outer contact member and the fourth outer contact member.

7. The assembly as described in claim 6, wherein the first inner contact member and said fourth inner contact member are of a through hole type.

8. The assembly as described in claim 1, wherein in each of some second passageways, the corresponding second contact is replaced by a pair of separate coplanar second inner contact member and outer contact member, and in each of some third passageways which are respectively aligned with said some second passageways, the corresponding third contact is replaced by a pair of separate coplanar third inner contact member and outer contact member, and a circuit trace is connected between the second inner contact member and the third inner contact member, and another circuit trace is connected between the second outer contact member and the third outer contact member.

9. The assembly as described in claim 7, wherein the second inner contact member and said third inner contact member are of a through hole type.

* * * * *